(12) United States Patent
Yan

(10) Patent No.: US 12,241,175 B2
(45) Date of Patent: Mar. 4, 2025

(54) DIAMOND SUBSTRATE AND METHOD FOR MANUFACTURING THE SAME

(71) Applicant: Chih Shiue Yan, Arcadia, CA (US)

(72) Inventor: Chih Shiue Yan, Arcadia, CA (US)

( * ) Notice: Subject to any disclaimer, the term of this patent is extended or adjusted under 35 U.S.C. 154(b) by 0 days.

(21) Appl. No.: 18/632,829

(22) Filed: Apr. 11, 2024

(65) Prior Publication Data

US 2024/0344236 A1 Oct. 17, 2024

Related U.S. Application Data

(60) Provisional application No. 63/458,735, filed on Apr. 12, 2023.

(51) Int. Cl.
| | |
|---|---|
| *B32B 3/02* | (2006.01) |
| *C30B 25/10* | (2006.01) |
| *C30B 25/18* | (2006.01) |
| *C30B 29/04* | (2006.01) |
| *C30B 33/04* | (2006.01) |

(52) U.S. Cl.
CPC .......... *C30B 25/186* (2013.01); *C30B 25/105* (2013.01); *C30B 29/04* (2013.01); *C30B 33/04* (2013.01)

(58) Field of Classification Search
CPC ...................................................... C30B 29/04
See application file for complete search history.

(56) References Cited

U.S. PATENT DOCUMENTS

| | | | | |
|---|---|---|---|---|
| 2006/0266279 | A1* | 11/2006 | Mokuno | C30B 7/005 117/903 |
| 2007/0051300 | A1* | 3/2007 | Bhandari | C30B 25/105 117/68 |
| 2007/0196263 | A1* | 8/2007 | Hemley | C30B 25/105 423/446 |

* cited by examiner

*Primary Examiner* — Elizabeth E Mulvaney
(74) *Attorney, Agent, or Firm* — Maschoff Brennan

(57) ABSTRACT

Disclosed is a manufacturing method of a diamond substrate, comprising a seed crystal preparing step of preparing seed crystal for a single crystal of high temperature/high pressure grown diamond or for a single crystal of vapor deposition grown diamond, a first growing step of growing the seed crystal through microwave plasma chemical vapor deposition method to obtain a first crystal, a second growing step of growing the first crystal through microwave plasma chemical vapor deposition method to obtain a second crystal, and a third growth step of growing the second crystal through a microwave plasma chemical vapor deposition method to obtain a diamond substrate.

6 Claims, 2 Drawing Sheets

DIAMOND SUBSTRATE AND METHOD FOR MANUFACTURING THE SAME

The present invention relates to a substrate and a method for manufacturing the same, and more particularly relates to a diamond substrate and a method for manufacturing the same.

BACKGROUND OF THE INVENTION

For semiconductor device research and development in corporate laboratories, a high-quality 2-inch diameter wafer is essential. However, the size of commercially available single crystal diamond (SCD) having ultrapure quantum grade grown by CVD method, i.e., nitrogen impurity below 5 ppb is limited to 4×4 mm².

Commercially accessible high-quality ultra-nanocrystalline diamond (UNCD) films where the grain size is around 2-5 nm in size have very poor thermal conductivity, which is 2 order lower than single crystal. In addition, polycrystalline diamond over 2" diameter has many remarkable attributions comparable to the finest natural diamonds, but grain boundaries can still impact its electronic performances due to the crystal defect nature and existence of various impurities such as nitrogen, silicon, and others. It therefore causes even though diamond heteroepitaxial growth has been extensively studied for several decades, the crystalline quality is still worse than that of HPHT.

SUMMARY OF THE INVENTION

Therefore, one objective of the present invention is to provide an electronic-grade SCD wafer without cracking, and reduce its internal stress through a mechanical buffer layer to eliminate point defects and holes in the electrochemical layer to solve the problems of the conventional technology.

In order to overcome the technical problems in prior art, the present invention provides a manufacturing method of a diamond substrate, comprising: a seed crystal preparing step of preparing seed crystal for a single crystal of high temperature/high pressure grown diamond or for a single crystal of vapor deposition grown diamond, wherein the X-ray full width at half maximum value of the seed crystal is less than 30 arc seconds and the size of the seed crystal is greater than 5 mm to 4 inch in diameter, the seed crystal is composed of multiple pieces, each piece having six surfaces with a Miller index of 100 connected through the following steps, and the seed surface of the seed crystal is prepared as a laser-cut wavy surface, a first growing step of growing the seed crystal through microwave plasma chemical vapor deposition method to obtain a first crystal, wherein the conditions of the microwave plasma chemical vapor deposition method are processing 3 to 5 days or are processing until the required thickness has reached for a requirement of heat dissipation modules, diamond tools, seed crystals, pink jewelry, yellow-red jewelry or quantum sensors under 850 to 1050° C., an atmosphere of 50 to 200 ppm nitrogen, a second growing step of growing the first crystal through microwave plasma chemical vapor deposition method to obtain a second crystal, wherein the conditions of the microwave plasma chemical vapor deposition method are processing under 850 to 1050° C. and 10 to 50 ppm nitrogen atmosphere until the required thickness has been reached for requirement of colorless jewelry, electronic grade materials or optical grade materials and a third growth step of growing the second crystal through a microwave plasma chemical vapor deposition method to obtain a diamond substrate, wherein the conditions of the microwave plasma chemical vapor deposition method are processing under 1100 to 1200° C. and 1 ppm or less of nitrogen atmosphere, then perform high-temperature annealing of 1500 to 2000° C. and growing at a rate of 5 µm/h to reach the thickness required for requirement of colorless jewelry, electronic grade materials, optical grade materials or quantum grade materials.

According to one embodiment of the present invention, the microwave plasma chemical vapor deposition method using a resonant vacuum cavity which applies microwave of 30 kw, 915 MHz and a wavelength of 32.8 cm or microwave having two wavelength diameters and one wavelength height of 2.45 Ghz and a wavelength of 12.25 cm.

According to one embodiment of the present invention, the manufacturing method further comprising a laser deep cutting step of performing cutting at a position offset by 5 to 7° from the surface of the seed crystal having a Miller index of 100 after the seed crystal preparing step to form height difference on the surface of the seed crystal.

According to one embodiment of the present invention, the manufacturing method further comprising a laser cutting step of forming square perforations, text, images or implanted metal circuits or other semiconductor material along the directions of 010 and 001 on the surface of the seed crystal having a Miller index of 100 after the seed crystal preparing step, then covering diamonds with the process of claim 1 to repair defects, or to manufacture a radiator and insulator.

In one embodiment, the present invention provides a diamond substrate made by the manufacturing method described above.

According to one embodiment of the present invention, the diamond substrate is composed of a single crystal diamond substrate with a diameter of 1 to 4 inches.

With the technical means adopted by the present invention, a diamond substrate can be provided, which reaches the same characteristic level as electronic grade single crystal diamond wafer without cracking, and reduces its internal stress through the mechanical buffer layer to eliminate the electrochemical layer point defects and holes.

DETAILED DESCRIPTION OF THE PREFERRED EMBODIMENTS

The preferred embodiments of the present invention are described in detail below. The description is used for explaining the embodiments of the present invention only, but not for limiting the scope of the claims.

Figure 1:
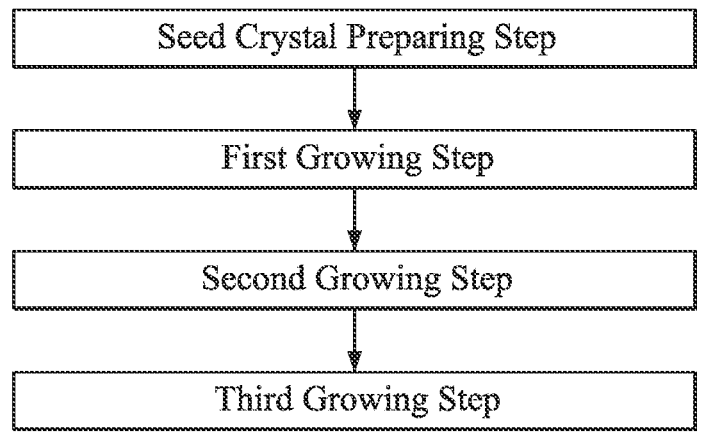
FIG. 1 is a flow chart of the manufacture method of diamond substrate according to the present invention.

FIG. 1 is a flow chart of the manufacture method of diamond substrate according to the present invention.

According to FIG. 1, the manufacture method of diamond substrate comprises a seed crystal preparing step, a first growing step, a second growing step and a third growth step.

In the seed crystal preparing step, seed crystal for a single crystal of high temperature/high pressure grown diamond or for a single crystal of vapor deposition grown diamond are prepared, wherein the X-ray full width at half maximum value of the seed crystal is less than 30 arc seconds and the size of the seed crystal is greater than 5 mm to 4 inch in diameter, the seed crystal is composed of multiple pieces, each piece having six surfaces with a Miller index of 100 connected through the following steps, and the seed surface of the seed crystal is prepared as a laser-cut wavy surface.

While an appropriate crystallographic directions is applied to avoid cracking, the seed's surface is to be prepared as wave-like surface of laser slicing without mechanically smooth polished, in order to create step-flow growth similar to the off (100) axis effect to promote the growth rate to make it possible to fabricate 2-inch wafers.

Then the first growing step is performed, the seed crystal is grown through microwave plasma chemical vapor deposition method to obtain a first crystal, wherein the conditions of the microwave plasma chemical vapor deposition method are processing 3 to 5 days or are processing until the required thickness has reached for a requirement of heat dissipation modules, diamond tools, seed crystals, pink jewelry, yellow-red jewelry or quantum sensors under 850 to 1050° C., an atmosphere of 50 to 200 ppm nitrogen The growth rate is about 10-15 μm/h in the first growing step. After 3-5 days' growing, the wafer will reach around 1 mm thick where the growing seeds have smoothly laterally connected together and have mechanic-grade high fracture toughness to prevent cracking as being a buffer layer. The mechanic grade indicates its nitrogen impurity in diamond is at ppm level.

Then the second growing step is performed, the first crystal grown through microwave plasma chemical vapor deposition method to obtain a second crystal, wherein the conditions of the microwave plasma chemical vapor deposition method are processing under 850 to 1050° C. and 10 to 50 ppm nitrogen atmosphere until the required thickness has been reached for requirement of colorless jewelry, electronic grade materials or optical grade materials.

Growing under these conditions for a couple days to produce colorless layer having optical grade whose thickness is about 1 mm thick. The optical grade indicates nitrogen impurity in diamond is in a level of several tens ppb.

Then the third growing step is performed, the second crystal is grown through a microwave plasma chemical vapor deposition method to obtain a diamond substrate, wherein the growing conditions of the microwave plasma chemical vapor deposition method are under 1100 to 1200° C. and in 1 ppm or less of nitrogen atmosphere, then perform high-temperature annealing of 1500 to 2000° C. and growing at a rate of 5 μm/h to reach the thickness required for requirement of colorless jewelry, electronic grade materials, optical grade materials or quantum grade materials.

By reducing the $N_2$ to below 10 ppm at temperature over 1100° C. to perform high temperature annealing to reduce the internal stress and force its point defects and vacancy to move and to be kept within mechanic grade layer having lower-temperature, and grow the ultrapure electronic grade level to several μm to hundreds μm in 5 μm/h of expected growth rate. The ultrapure electronic grade indicates nitrogen impurity in diamond is below 10 ppb level.

Figure 2:
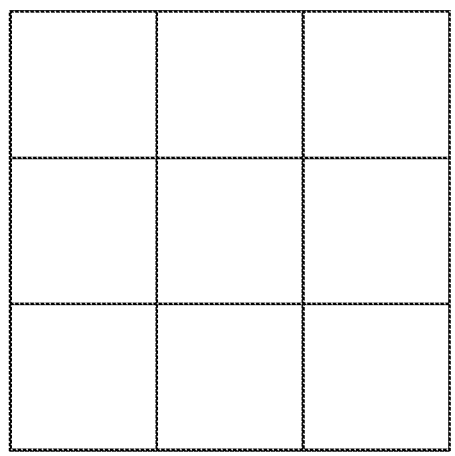
FIG. 2 is a figure showing an embodiment of a diamond substrate according to the present invention.

FIG. 2 shows an embodiment of a diamond substrate according to the present invention, wherein a plurality of single crystal chips, each chip having six surfaces with a Miller index of 100, are arranged into a large wafer, e.g., arranging 9 pieces of 10×10×1 mm into a mosaic arrangement of 30×30×1 mm wafers, and then through the first growth step to grow diamonds on the wafer to connect chips together.

Figure 3:
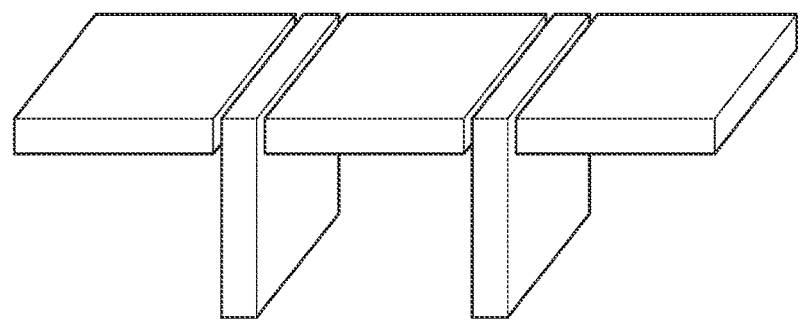
FIG. 3 is three-dimensional view of a heat dissipation module made according to the diamond substrate of the present invention.

FIG. 3 is a three-dimensional view illustrating a radiator module obtained according to the diamond substrate of the present invention, a plurality of single crystal chips, each chip having six surfaces with a Miller index of 100, are arranged three-dimensionally to form a radiator module, e.g., arranging 5 pieces of 10×10×1 mm three-dimensionally into a 32×10×10 mm radiator module, and then diamonds are grown through the first growth step to connect the chips together.

Figure 4:
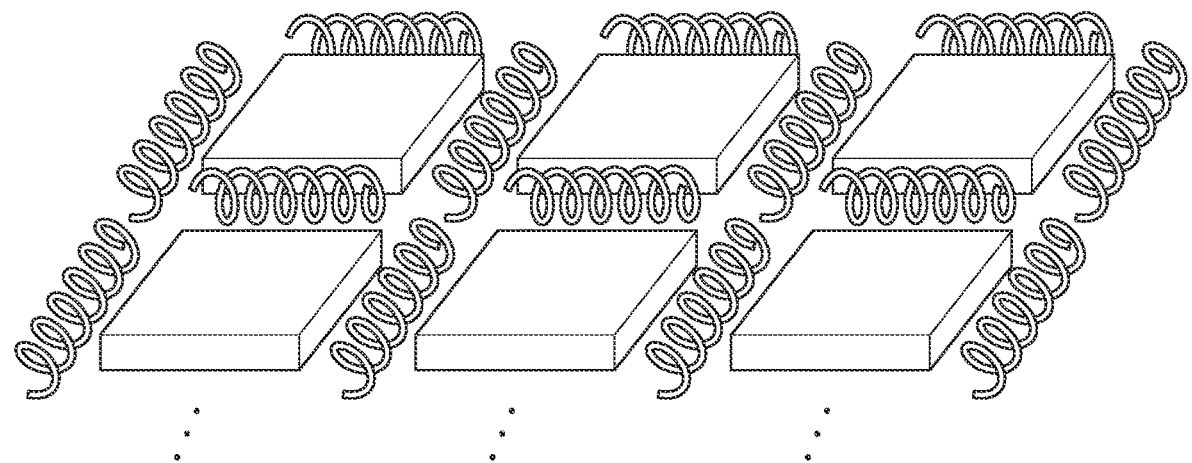
FIG. 4 is three-dimensional view of the structure of a diamond substrate product according to the present invention.

FIG. 4 is a three-dimensional view illustrating a structure of a diamond substrate for an insulator or a good radiator module according to the present invention. There are grooves between each neighboring single chip in the single-chip arrays, wherein a metal wire is placed in each groove, and then diamonds are grown on the chips and grooves to cover the chips and grooves through the first growth step to form the insulator or the good radiator module. According to the manufacturing method of diamond substrate of the present invention, a diamond substrate can be provided, which obtains the electronic grade single crystal diamond wafer without cracking, and reduces an internal stress through the mechanical buffer layer to eliminate the electrochemical layer point defects and holes.

The above description should be considered as only the discussion of the preferred embodiments of the present invention. However, a person having ordinary skill in the art may make various modifications without deviating from the present invention. Those modifications still fall within the scope of the present invention.

What is claimed is:

1. A manufacturing method of a diamond substrate, comprising:

a seed crystal preparing step of preparing seed crystal for a single crystal of high temperature/high pressure grown diamond or for a single crystal of vapor deposition grown diamond, wherein the X-ray full width at half maximum value of the seed crystal is less than 30 arc seconds and the size of the seed crystal is greater than 5 mm to 4 inch in diameter, the seed crystal is composed of multiple pieces, each piece having six surfaces with a Miller index of 100 being connected through the following steps, and the seed surface of the seed crystal is prepared as a laser-cut wavy surface;

a first growing step of growing the seed crystal through microwave plasma chemical vapor deposition method to obtain a first crystal, wherein the conditions of the microwave plasma chemical vapor deposition method are processing 3 to 5 days or are processing until the required thickness has reached for a requirement of heat dissipation modules, diamond tools, seed crystals, pink jewelry, yellow-red jewelry or quantum sensors under 850 to 1050° C., an atmosphere of 50 to 200 ppm nitrogen;

a second growing step of growing the first crystal through microwave plasma chemical vapor deposition method to obtain a second crystal, wherein the conditions of the microwave plasma chemical vapor deposition method are processing under 850 to 1050° C. and 10 to 50 ppm nitrogen atmosphere until the required thickness has been reached for requirement of colorless jewelry, electronic grade materials or optical grade materials; and a third growth step of growing the second crystal through a microwave plasma chemical vapor deposition method to obtain a diamond substrate, wherein the conditions of the microwave plasma chemical vapor deposition method are processing under 1100 to 1200° C. and 1 ppm or less of nitrogen atmosphere, then perform high-temperature annealing of 1500 to 2000° C. and growing at a rate of 5×m/h to reach the thickness required for requirement of colorless jewelry, electronic grade materials, optical grade materials or quantum grade materials.

2. The manufacturing method as claimed in claim 1, wherein the microwave plasma chemical vapor deposition method using a resonant vacuum cavity which applies microwave of 30 kw, 915 MHz and a wavelength of 32.8 cm or microwave having two wavelength diameters and one wavelength height of 2.45 Ghz and a wavelength of 12.25 cm.

3. The manufacturing method as claimed in claim 1, further comprising a laser deep cutting step of performing cutting at a position offset by 5 to 7° from the surface of the seed crystal having a Miller index of 100 after the seed crystal preparing step to form height difference on the surface of the seed crystal.

4. The manufacturing method as claimed in claim 1, further comprising a laser cutting step of forming square perforations, text, images or implanted metal circuits or other semiconductor material along the directions of 010 and 001 on the surface of the seed crystal having a Miller index of 100 after the seed crystal preparing step, then covering diamonds with the process of claim 1 to repair defects, or to manufacture a radiator and insulator.

5. A diamond substrate made by the manufacturing method as claimed in claim 1.

6. A diamond substrate as claimed in claim 5, wherein the diamond substrate is composed of a single crystal diamond substrate with a diameter of 1 to 4 inches.

* * * * *